(12) United States Patent
Chen et al.

(10) Patent No.: US 6,426,271 B2
(45) Date of Patent: Jul. 30, 2002

(54) METHOD OF ROUNDING THE CORNER OF A SHALLOW TRENCH ISOLATION REGION

(75) Inventors: Yi-Nan Chen, Taipei; Hsien-Wen Liu, Tainan, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/790,493

(22) Filed: Feb. 23, 2001

(30) Foreign Application Priority Data

Jun. 9, 2000 (TW) ........................................ 89111252 A

(51) Int. Cl.$^7$ .............................................. H01L 21/76
(52) U.S. Cl. ...................... 438/435; 438/424; 438/436; 438/437; 438/770
(58) Field of Search ................................ 438/424, 435, 438/436, 437, 770

(56) References Cited

U.S. PATENT DOCUMENTS

2001/0048142 A1 * 12/2001 Urakami et al.

* cited by examiner

Primary Examiner—Long Pham
(74) Attorney, Agent, or Firm—Birch, Stewart, Kolasch & Birch, LLP

(57) ABSTRACT

The present invention provides a method of rounding the corner of the shallow trench isolation region, comprising the steps of: etching silicon substrate using a patterned mask layer and a pad oxide layer as an etch mask to form a trench in the silicon substrate, then removing part of the pad oxide layer, forming silicon dioxide on the surface of the silicon substrate in the trench, then removing part of the pad oxide layer and the silicon dioxide on the surface of the silicon substrate in the trench, repeating the step of oxidizing the surface of the silicon substrate and removing part of the pad oxide layer and silicon dioxide to round the corner of the trench, then performing the subsequent steps to form the shallow trench isolation region.

20 Claims, 5 Drawing Sheets

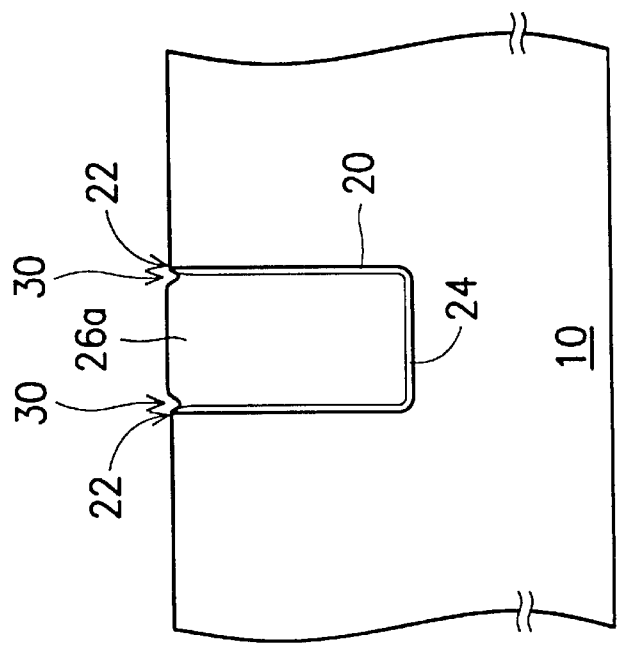
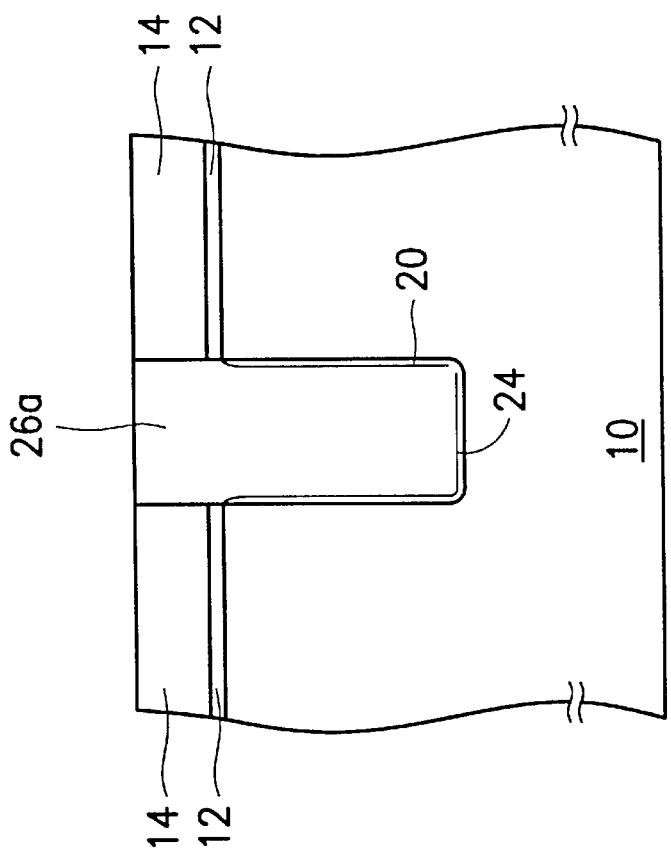
FIG. 1C
PRIOR ART
FIG. 1D
PRIOR ART

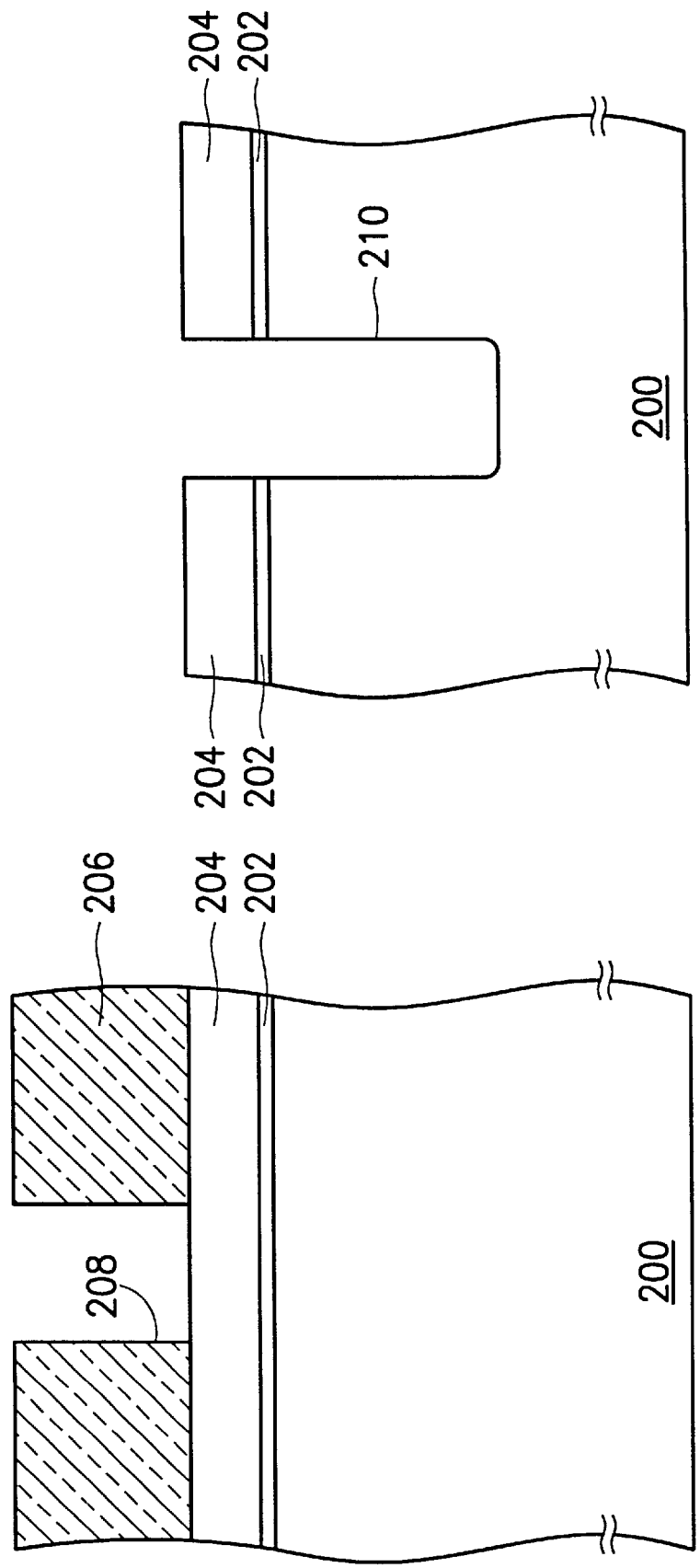

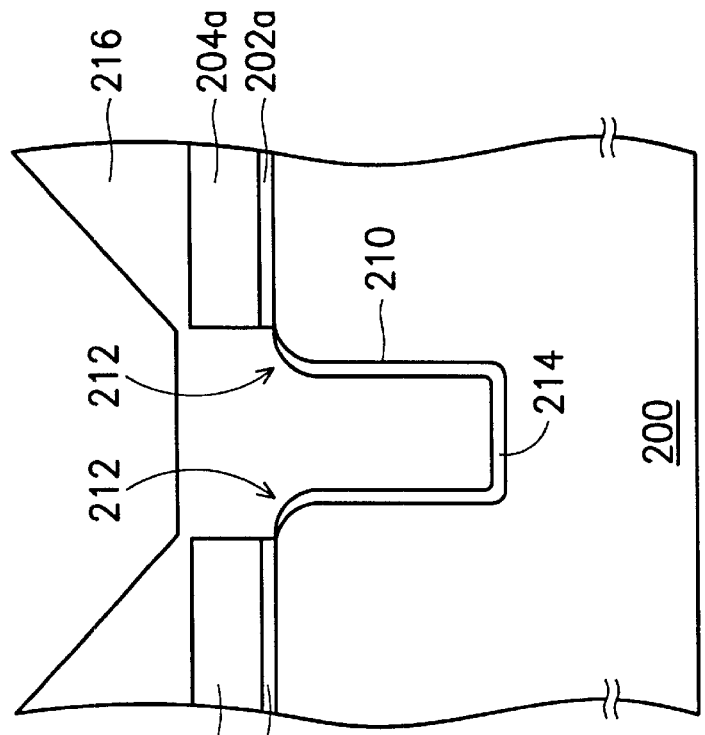
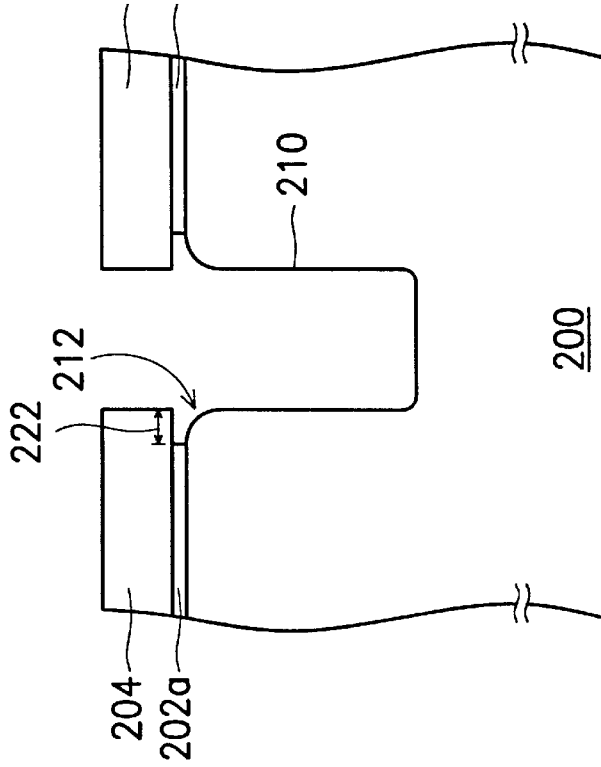
FIG. 2C
FIG. 2D

METHOD OF ROUNDING THE CORNER OF A SHALLOW TRENCH ISOLATION REGION

BACKGROUND OF THE INVENTION

1. Field of the Invention

The present invention relates to a method of rounding the corner of shallow trench isolation region, more particularly to a chemical method of rounding the corner of the shallow trench isolation region.

2. Description of the Prior Art

Recently, as the manufacturing techniques of semiconductor integrated circuits develop, the number of elements in a chip increases. The size of the element decreases as the degree of integration increases. The line width used in manufacturing lines has decreased from sub-micron to quarter-micron, or even to a smaller size. However regardless of the reduction of the size of the element, adequate insulation or isolation must be formed among individual elements in the chip so that good element characteristics can be achieved. This technique is called device isolation technology. The main object is to form an isolation region, and reduce the size of the isolation to as small as possible while assuring good isolation effect to have larger chip space for more elements.

Among different element isolation techniques, LOCOS and shallow trench isolation region manufacturing methods are the two most used methods. In particular, as the latter has the small isolation region and can maintain the substrate to be level after the process is finished, it is the semiconductor manufacturing method obtaining the most attention.

The conventional manufacturing method for shallow trench isolation region is shown in the cross sectional views of FIGS. 1A to 1D.

Refer to FIG. 1A. A pad oxide layer 12 is formed on a silicon substrate 10 using thermal oxidation and a silicon nitride layer 14 is deposited on the pad oxide layer 12 using the CVD method. Next, a photoresist layer 16 is coated on the silicon nitride layer 14 and is patterned using photolithography to expose the portion where the element isolation region is to be formed. Silicon nitride layer 14 and pad oxide layer 12 are etched sequentially using the photoresist layer 16 as a mask.

Next, refer to FIG. 1B, after photoresist layer 16 is removed with adequate liquid, silicon nitride layer 14 and pad oxide layer 12 are used as a mask to etch silicon substrate 10 to form trench 20 inside to define the active region of the element. Subsequently, thermal oxidation is performed to grow a thin silicon oxide layer as the lining oxide layer 24 on the bottom and sidewall of the trench 20. However, when silicon oxide is formed, the stress is concentrated on the curvature region of a smaller radius, and the corner 22 of trench 20 is a sharp curvature of small radius, the growing speed of the silicon oxide at the corner 22 of the trench 20 is slower, so that the lining oxide layer 24 at the corner 22 of the trench 20 is very thin.

Next, chemical vapor deposition is performed, for example using $O_3$ and TEOS as a reactant to form oxide layer 26, and fill the trench 20 and cover the surface of the silicon nitride layer 14.

Next, refer to FIG. 1C. A chemical mechanical polishing process is performed, the part of oxide layer 26 that is higher than the surface of the silicon nitride layer 14 is removed to form the isolation region 26a with a level surface. Subsequently, a suitable etching method is used to remove the silicon nitride layer 14 and pad oxide layer 12 in order to complete the manufacturing of the shallow trench isolation, and obtain the structure shown in FIG. 1D.

Because the property of the element isolation region 26a is similar to that of the pad oxide layer 12, when etching liquid is used to dip pad oxide layer 12, the element isolation region 26a is inevitably etched so that the corner 22 of the trench 20 is exposed and an indentation 30 is formed next to the corner 22 of the trench 20.

Thus, when the gate oxide layer and gate conductive layer are formed later, the conductive layer deposited in the indentation 30 is not easy to remove and a short circuit between the adjacent transistors is easily formed. In addition, since the gate oxide layer at the corner 22 of the trench 20 is thinner than other places, a parasitic transistor is formed. This phenomenon is equivalent to two transistors with gate oxide layers of different thickness in parallel. When current goes through this parasitic transistor, as the curvature radius of the corner 22 of the trench 20 is small, the electric fields concentrate and the Fowler-Nordheim current increases, hence the insulating property of the gate oxide layer of the corner 22 degrades, resulting in abnormal element characteristics. For example, there is a kink effect in I-V curvature of $I_d$ and $V_g$, which generates a double hump.

SUMMARY OF THE INVENTION

From the above, the present invention provides a method of increasing the curvature radius of the corner of the trench.

Furthermore, the present invention provides a manufacturing method, which avoids forming a trench isolation region of parasitic transistors at the corner of the trench.

Furthermore, the present invention provides a manufacturing method of forming a trench isolation region, which avoids the short circuit that occurs between adjacent transistors.

Therefore, the present invention provides a method of rounding the corner of the shallow trench isolation region, the method includes: forming a pad oxide layer and mask layer sequentially on silicon substrate and patterning them, and then using the patterned pad oxide layer and mask layer as the etching mask to etch the silicon substrate and form the trench in the silicon substrate; next, use the oxidizing agent and HF liquid in turn to round the trench corner, subsequently remove part of the mask layer to expose the rounded corner of the trench, then forming an oxide layer to fill the trench, finally removing the mask layer and the pad oxide layer to form a trench isolation region.

According to one preferred embodiment of the present invention, the concentration of the HF liquid is about 0.3% to 2%. Oxidizing agents include $H_2O_{2(aq)}$ and $HNO_{3(aq)}$. The concentration of the $H_2O_{2(aq)}$ is about 5% to 20%; the concentration of the $HNO_{3(aq)}$ is about 3% to 30%. In the process of alternating use of the oxidizing agent and HF liquid, a de-ionizing water process, after the oxidizing agent and HF liquid process, is included.

The present invention provides a method of rounding the corner of the shallow trench isolation region, which includes the following steps: forming a pad oxide layer and a mask layer sequentially on a silicon substrate, and patterning them, then using patterned pad oxide layers and mask layers as etching masks to etch the silicon substrate and form a trench in the silicon substrate; next, after part of the pad oxide layer is removed, the surface of the silicon substrate in the trench is oxidized to form silicon dioxide, then part of pad oxide layer and silicon dioxide of the surface of the silicon substrate in the trench is removed, and repeating the step of oxidizing the surface of the silicon substrate and the step of removing part of the pad oxide layer and silicon dioxide until the corner of the trench is rounded, then part of the mask layer is removed to expose the rounded corner of the trench, to form an oxide layer, filling the trench, finally removing the mask layer and the pad oxide layer to form the trench isolation region.

According to a preferred embodiment of the present invention, the method of oxidizing the silicon substrate includes using an oxidizing agent, this oxidizing agent includes $H_2O_{2(aq)}$ and $HNO_{3(aq)}$, after using this oxidizing agent, the method further includes a de-ionizing water process. The method of removing part of the pad oxide layer and silicon dioxide includes using HF liquid, after using this HF liquid, the method further includes a de-ionizing water process.

BRIEF DESCRIPTION OF THE DRAWINGS

The following detailed description, given by way of example and not intended to limit the invention solely to the embodiments described herein, will best be understood in conjunction with the accompanying drawings, in which:

FIGS. 1A to 1D show the cross-sectional view of the manufacturing process of the conventional shallow trench isolation region;

FIGS. 2A to 2E show the cross sectional view of the process of the corner rounding of a shallow trench isolation region in accordance with a preferred embodiment of the present invention.

DETAILED DESCRIPTION OF THE INVENTION

Figure 1B:
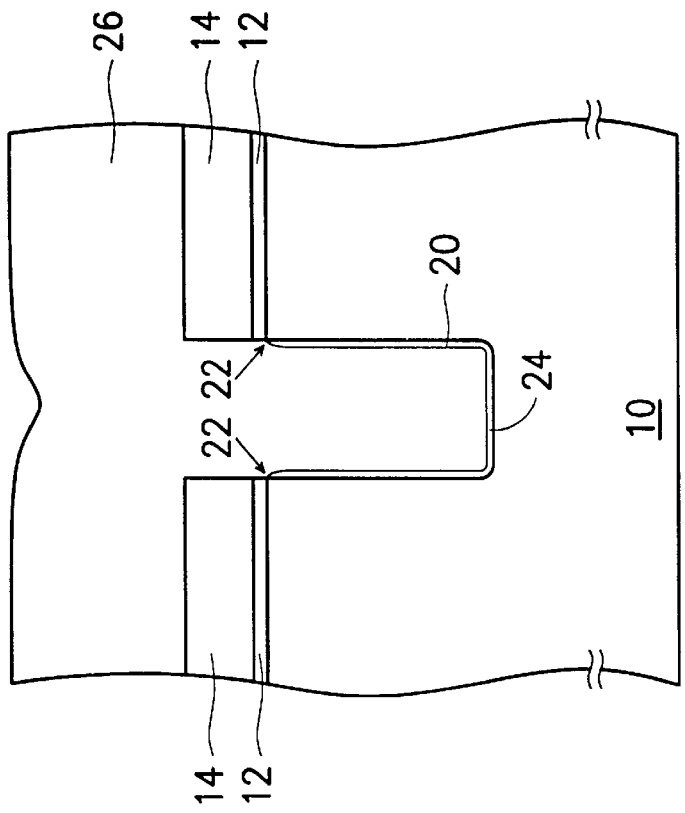
Figure 1A:
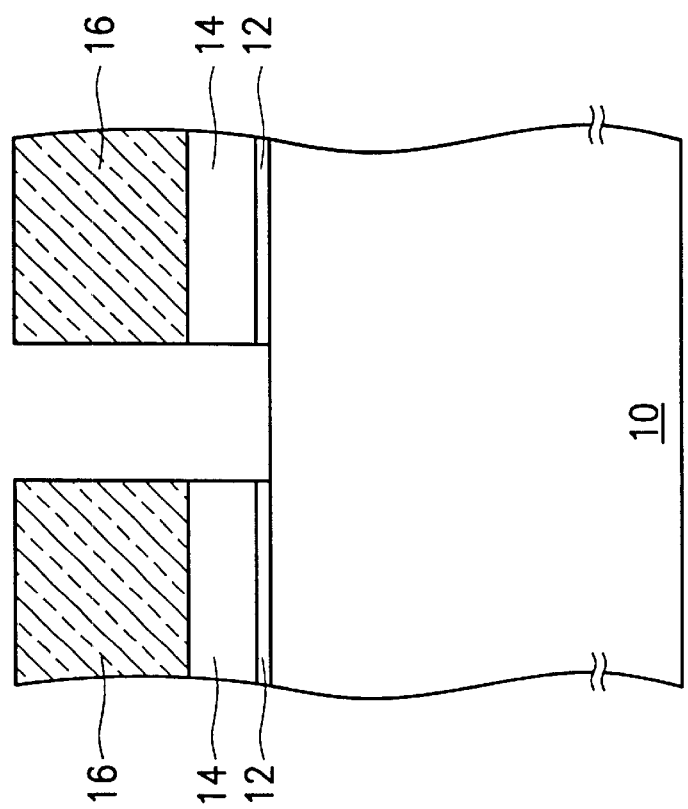

Embodiment:

FIGS. 2A to 2E show the cross sectional view of the process of corner rounding of a shallow trench isolation region in accordance with a preferred embodiment of the invention.

First refer to FIG. 2A. A semiconductor substrate, for example silicon substrate 200 is provided. A pad insulation layer (for example, pad oxide layer 202) and a mask layer 204 are formed sequentially on the surface of the silicon substrate 200. The method of forming the pad oxide layer 202 is thermal oxidation or chemical vapor deposition, in which the thermal oxidation is preferred. The mask layer is silicon nitride; its forming method is for example chemical vapor deposition. Next, a photoresist layer 206 is coated on the surface of the mask layer 204, the photolithography is performed to define the photoresist pattern required to form opening 208, the size of the opening is substantially the size of the element isolation region.

Next, refer to FIG. 2B. The patterned photoresist layer 206 is used as a mask to isotropicly etch the mask layer 204 and the pad oxide layer 202, for example reactant ion etch process (RIE), to transfer the pattern of the photoresist layer 206 to mask layer 204 and the pad oxide layer 202. Then, suitable liquid or dry etch process is performed to remove photoresist layer 206.

Next, an isotropic etching process is performed using the mask layer 204 and pad oxide layer 202 as an etch mask, for example, the RIE process, etching silicon substrate 200 to a predetermined depth to form a trench 210 in the silicon substrate 200.

Next, refer to FIG. 2C. A wet processing step is performed. This wet processing step includes using $HF_{(aq)}$ to remove part of the pad oxide layer 202, then using an oxidizing agent to oxidize the surface of the silicon substrate 200 in the trench to form silicon dioxide ($SiO_2$) and using HF liquid to remove part of the pad oxide layer 202 and the formed silicon dioxide until the corner 212 of the trench 210 is rounded. At this time, the pad oxide layer 202 becomes a pad oxide layer 202a as shown; the length removed is about 130Å, i.e., the distance between the side of the mask layer 204 and the side of the pad oxide layer 202a is about 130Å.

In the above wet processing step, the concentration of the HF liquid is 0.3% to 2%. The oxidizing agent includes $H_2O_{2(aq)}$, $HNO_{3(aq)}$ or other liquids with similar properties. The concentration of $H_2O_{2(aq)}$ is about 5% to 20%; the concentration of $HNO_{3(aq)}$ is about 3% to 30%. This wet processing step can be performed by dipping or spreading.

In the above wet processing step, using $H_2O_{2(aq)}$ as the oxidizing agent, for example, when silicon substrate 200 is processed by $H_2O_{2(aq)}$, the following oxidation-reduction reaction occurs:

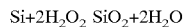

When all Si on the surface of the silicon substrate 200 in the trench 210 is oxidized to become $SiO_2$, the reaction stops. Thus, the thickness of silicon lost is about 10 Å.

Subsequently, the following etch reaction occurs when $SiO_2$ is processed by $HF_{(aq)}$:

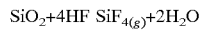

So that $SiO_2$ on the pad oxide layer 202 or the surface of the silicon substrate 200 in the trench 210 will react to form volatile $SiF_{4(g)}$.

It should be noted that the oxidizing agent and HF liquid cannot be used at the same time, or the reaction will get out of control.

Therefore, after silicon substrate is processed by oxidizing agent or HF liquid, it is washed using de-ionized water (DIW) to prevent unreacted oxidizing agents and HF liquid from being present at the same time or to prevent unreacted HF liquid and oxidizing agents from being present at the same time, to control more precisely the degree of the reaction.

To further elaborate this wet processing step, using the $H_2O_2$ as the oxidizing agent, and using dipping to perform set processing, the detailed process is as follows:

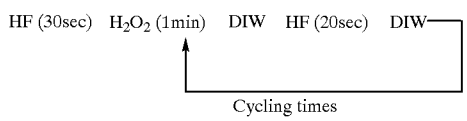

Wherein HF (30sec) means soaking for 30 seconds in HF liquid of 1% concentration for 30 seconds, HF (20 seconds) means soaking for 20 seconds, $H_2O_2$ (1 minute) means soaking $H_2O_2$ liquid of 35% concentration for 1 minute. Under this condition, the number of preferred cycling times is 5.

Next, referring to FIG. 2D, remove some of the mask layer 204 to rounded corner 212 of the exposed trench 210 to form the mask layer 204a as shown in the diagram, so that the subsequent oxides is easily filled into the trench 210. The method of removing part of the mask 204, for example, is soaking with hot $H_3PO_4$. Subsequently, a pad oxide layer 214 is formed on the surface of the silicon substrate 200 in the trench 210, the method of forming may be for example, a rapid thermal oxidation process, the thickness of the formed pad oxide layer 214 is about 130 Å. Next, an insulating layer is formed above the mask layer 204a, for example, the oxide layer 216, and fills the trench 210 and covers the rounded corner 212 of the trench 210. The method of forming the oxide layer 216 uses high-density plasma deposition. Subsequently, an annealing process or rapid thermal process is performed to densitize the oxide layer 216. The annealing process is performed for example, under a nitrogen atmosphere.

Figure 2E:
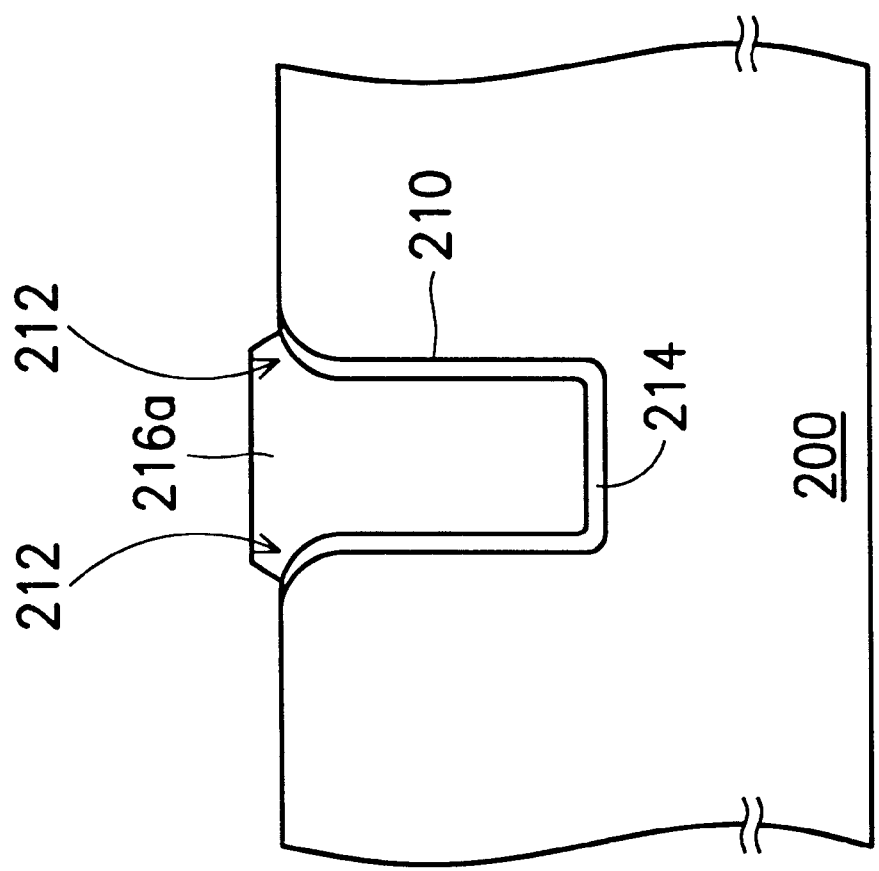

Next, refer to FIG. 2E, after removing the oxide layer 216 above the mask layer 204a, mask layer 204a and pad oxide layer 202a are removed sequentially to form the trench isolation region 216a. The method removing the oxide layer 216 above the mask layer 204a is for example, a chemical mechanical polishing method. The method of removing mask layer 204a is for example, soaking with hot $H_3PO_4$. The method of removing pad oxide layer 202a is for example, soaking with HF liquid. In addition, when removing pad oxide layer 202a, part of the oxide layer 216 will be removed at the same time. However, since the corner 212 of the trench 210 is rounded, the space blockage of the conducting material formed subsequent to the removing will not result, thus removing is easier to complete; Furthermore, the thickness of the gate oxide layer subsequently formed is more even. Also, because the curvature radius of the corner 212 of the trench 210 is larger, the electric fields are not concentrated at this region.

THE FEATURE AND EFFECT OF THE INVENTION

From the above, the invention provides at least the following advantages:

1. The curvature radius of the corner of the trench of the present invention is larger than the corner of the trench formed in the shallow trench isolation region by the conventional manufacturing method.
2. Since the corner of the trench in the present invention is already rounded, the thickness of the gate oxide layer subsequently formed in this region is the same as in the other regions, thus no parasitic transistors will form and hence the problems that evolved with the parasitic transistors will not occur.
3. Since the corner of the trench of the present invention is already rounded, the conductive material subsequently formed in this region has no space blockage and is easily removed, thus preventing the short circuit between the adjacent transistors. Therefore, the shallow trench isolation region of the invention has good electrical insulation.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of rounding the corner of a shallow trench isolation region, comprising:
   forming a pad insulating layer and a mask layer on a semiconductor substrate sequentially;
   patterning the pad insulating layer and the mask layer, and etching the semiconductor substrate using the patterned pad insulating layer and the mask layer as the etch mask to form a trench in the semiconductor substrate;
   using the oxidizing agent and the hf liquid alternately to round the corner of the trench;
   removing part of the mask layer to the rounded corner that exposes the trench;
   forming an insulating layer, filling the trench and covering the rounded corner of the trench; and
   removing the mask layer and the pad insulating layer to form the trench isolation region.

2. The method as claimed in claim 1, wherein the concentration of the HF liquid in the wet processing step is 0.3% to 2%.

3. The method as claimed in claim 1, wherein the oxidizing agent comprises $H_2O_2$ liquid.

4. The method as claimed in claim 3, wherein the concentration of the $H_2O_2$ liquid is 5% to 20%.

5. The method as claimed in claim 1, wherein the oxidizing agent comprises $HNO_3$ liquid.

6. The method as claimed in claim 5, wherein the concentration of the $HNO_3$ liquid is 3% to 30%.

7. The method as claimed in claim 1, wherein during the process of alternately using the oxidizing agent and HF liquid, further comprising de-ionized water process after the HF liquid process.

8. The method as claimed in claim 1, wherein during the process of alternately using the oxidizing agent and HF liquid, further comprising de-ionized water process after the oxidizing agent process and the HF liquid process.

9. The method as claimed in claim 1, wherein before the process of alternately using the oxidizing agent and HF liquid, further comprising HF liquid process.

10. The method as claimed in claim 1, wherein before the insulating layer is formed, further comprising forming a lining oxide layer on the surface of the semiconductor substrate in the trench.

11. A method of rounding the corner of a shallow trench isolation region, comprising the following steps:
    (a) forming a pad oxide layer and a mask layer on the silicon substrate sequentially;
    (b) patterning the pad oxide layer and the mask layer and etching the silicon substrate using the patterned pad oxide layer and mask layer as an etch mask to form a trench in the silicon substrate;
    (c) removing part of the pad oxide layer;
    (d) oxidizing the surface of the silicon substrate in the trench to form silicon dioxide;
    (e) removing part of the pad oxide layer and silicon dioxide on the surface of the silicon substrate of the trench;
    (f) repeating steps (d) and (e) until the corner of the trench is rounded;
    (g) removing part of the mask layer to the rounded corner that exposes the trench;
    (h) forming an oxide layer, filling the trench and covering the rounded corner of the trench; and
    (i) removing the mask layer and the pad oxide layer to form the trench isolation region.

12. The method as claimed in claim 11, wherein in the step (d) of forming silicon dioxide on the surface of the silicon substrate in the trench, an oxidizing agent is used.

13. The method as claimed in claim 12, wherein after the process of using the oxidizing agent, a de-ionized water process is used.

14. The method as claimed in claim 12, where the oxidizing agent includes either the $H_2O_2$ liquid or the $HNO_3$ liquid.

15. The method as claimed in claim 14, wherein the concentration of the $H_2O_2$ liquid is 5% to 20%.

16. The method as claimed in claim 14, wherein the concentration of the $HNO_3$ liquid is 3% to 30%.

17. The method as claimed in claim 11, wherein in the steps (c) and (e) of removing part of the pad oxide layer and silicon dioxide on the silicon substrate of the trench comprises using HF liquid.

18. The method as claimed in claim 17, wherein after using HF liquid, a de-ionized water process is used.

19. The method as claimed in claim 17, wherein the concentration of the HF liquid is 0.3% to 2%.

20. The method as claimed in claim 11, wherein in step (f), further comprises repeating steps (d) and (e) five times.

* * * * *